(12) United States Patent
Takai

(10) Patent No.: US 8,007,960 B2
(45) Date of Patent: Aug. 30, 2011

(54) LIGHT REFLECTING MASK, EXPOSURE APPARATUS, AND MEASURING METHOD

(75) Inventor: Kosuke Takai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 129 days.

(21) Appl. No.: 12/405,557

(22) Filed: Mar. 17, 2009

(65) Prior Publication Data

US 2009/0273772 A1 Nov. 5, 2009

(30) Foreign Application Priority Data

Apr. 30, 2008 (JP) .................................. 2008-119293

(51) Int. Cl.
*G03F 1/00* (2006.01)
(52) U.S. Cl. ........................................................... 430/5
(58) Field of Classification Search .............. 430/5, 22, 430/30; 378/35; 438/401
See application file for complete search history.

(56) References Cited

U.S. PATENT DOCUMENTS

| | | | | |
|---|---|---|---|---|
| 6,013,399 | A | * | 1/2000 | Nguyen ............................. 430/5 |
| 6,383,888 | B1 | * | 5/2002 | Stirton ........................... 438/401 |
| 6,650,421 | B2 | | 11/2003 | Magome |
| 7,084,982 | B2 | | 8/2006 | Yamamoto et al. |
| 7,314,688 | B2 | * | 1/2008 | Shoki ................................. 430/5 |
| 2006/0221316 | A1 | | 10/2006 | Yamamoto |

FOREIGN PATENT DOCUMENTS

JP 2004-61177 2/2004

* cited by examiner

*Primary Examiner* — Stephen Rosasco
(74) *Attorney, Agent, or Firm* — Finnegan, Henderson, Farabow, Garrett & Dunner, L.L.P.

(57) ABSTRACT

A light reflecting mask includes a reflecting layer which is provided on a substrate and reflects light, an absorbing layer which is provided on the reflecting layer and absorbs light, a device pattern which is formed in a first region of the absorbing layer, and a reflectance measuring pattern which is formed in a second region of the absorbing layer. The reflectance measuring pattern is a diffraction grating.

7 Claims, 6 Drawing Sheets

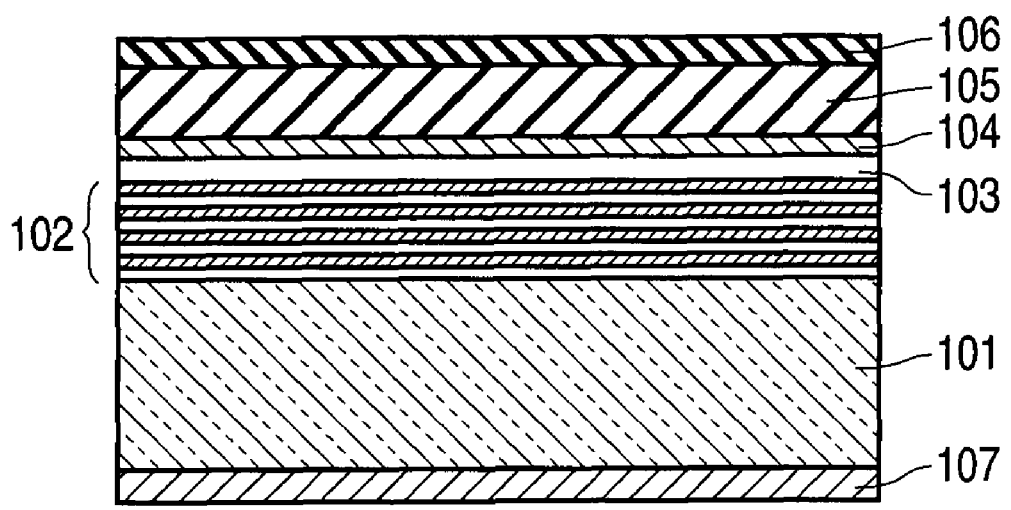
F I G. 1
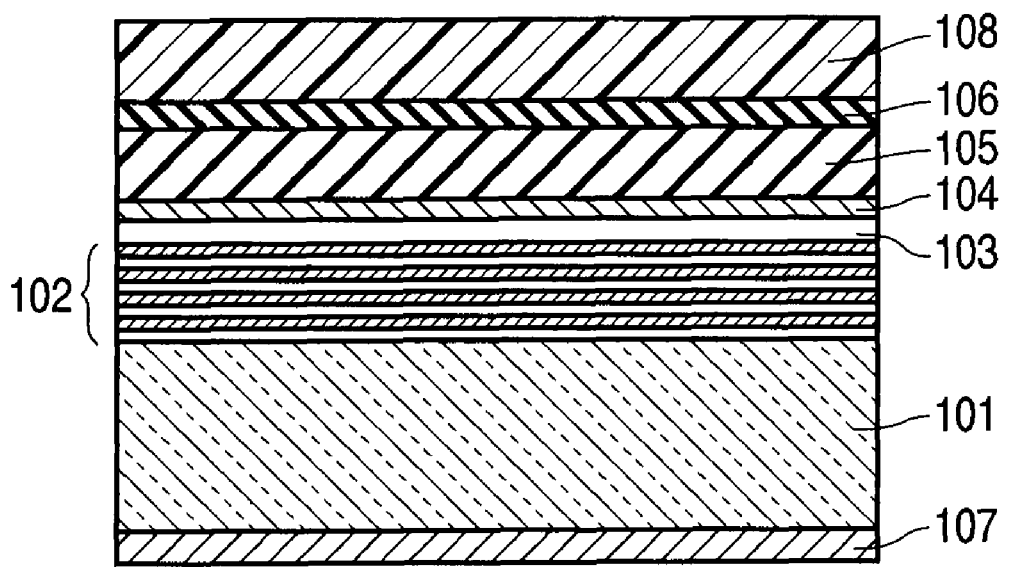
F I G. 2

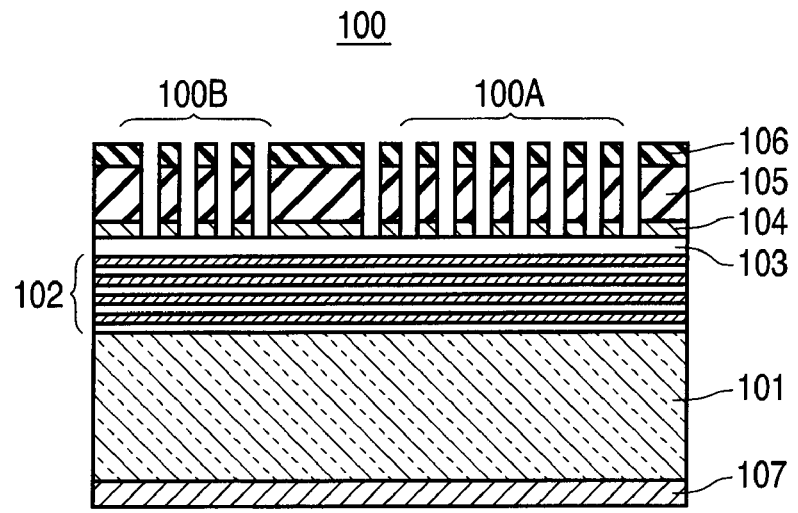
F I G. 5
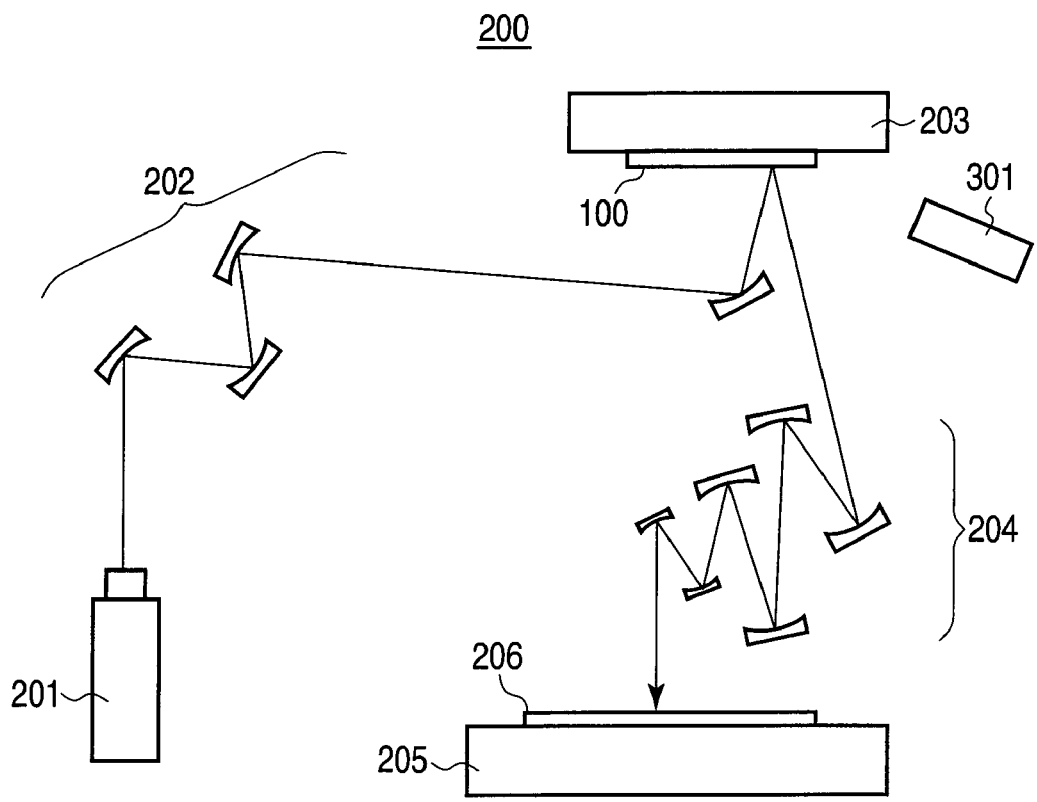
F I G. 6

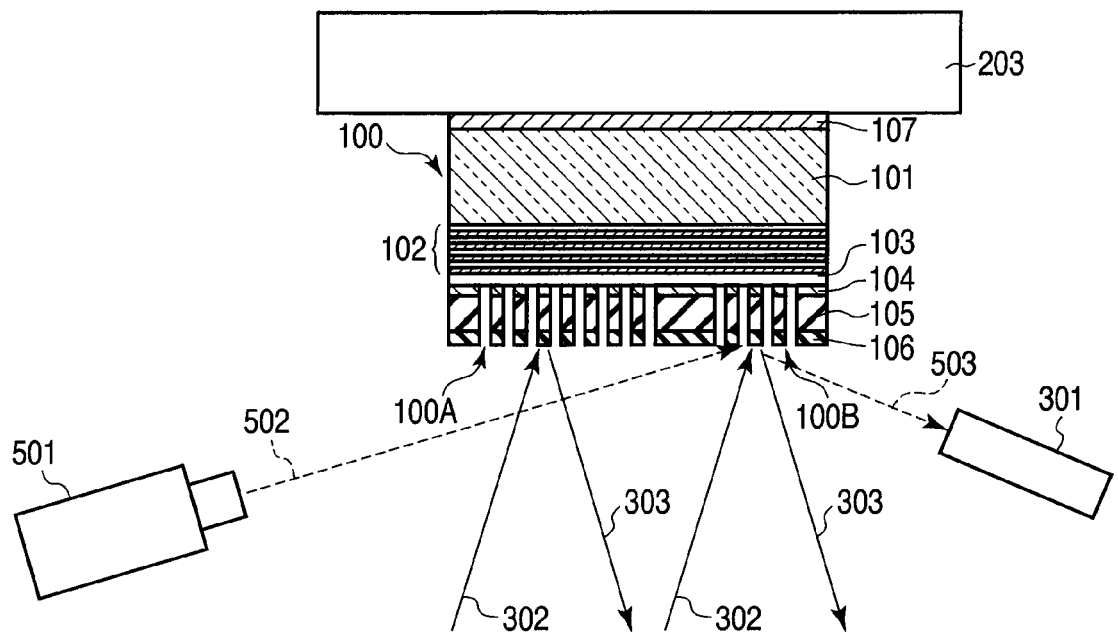
F I G. 10
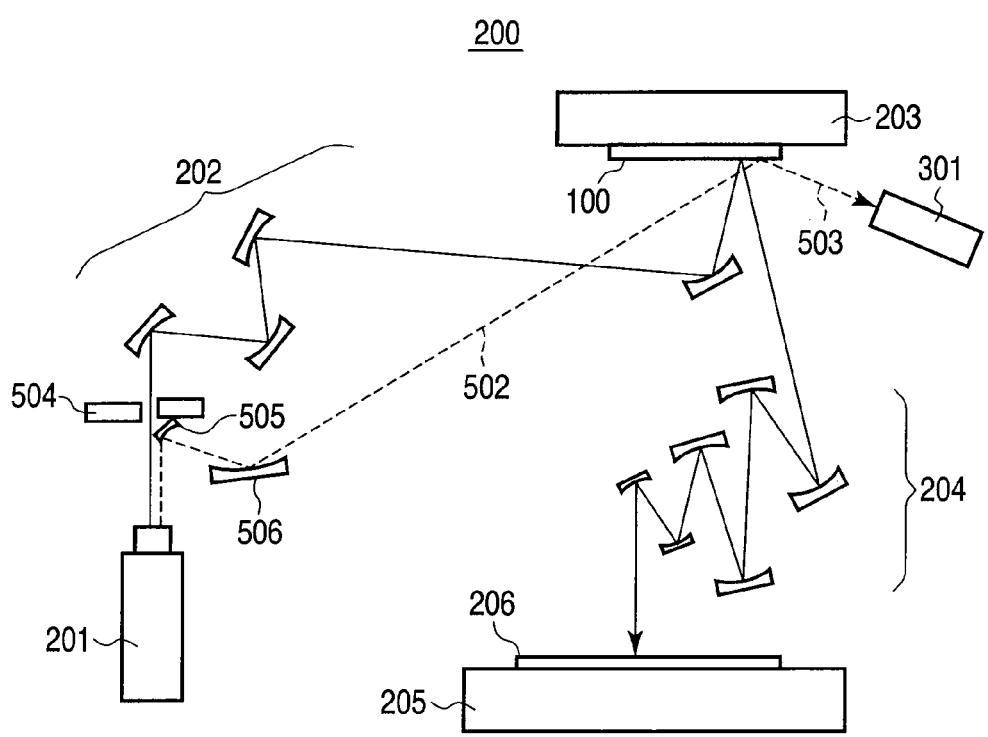
F I G. 11

US 8,007,960 B2

LIGHT REFLECTING MASK, EXPOSURE APPARATUS, AND MEASURING METHOD

CROSS-REFERENCE TO RELATED APPLICATIONS

This application is based upon and claims the benefit of priority from prior Japanese Patent Application No. 2008-119293, filed Apr. 30, 2008, the entire contents of which are incorporated herein by reference.

BACKGROUND OF THE INVENTION

1. Field of the Invention

The present invention relates to a light reflecting mask, an exposure apparatus, and a measuring method used for lithography using extreme ultraviolet (EUV) light.

2. Description of the Related Art

In lithography using EUV light having a wavelength of about 13.5 nm, a light reflecting mask capable of transferring a pattern by reflecting exposure light is used. The light reflecting mask is formed by, e.g., sequentially stacking, on a glass substrate, a reflecting layer which reflects light, a cap layer made of silicon (Si) or the like, and an absorbing layer which absorbs light. A pattern is formed by partially etching the absorbing layer.

The reflectance of the light reflecting mask having such a structure decreases along with the repeat of exposure because of the influence of oxidation or corrosion of the exposed cap layer surface or substances sticking to it. This degrades the image contrast when transferring the pattern onto a wafer.

A reference (Jpn. Pat. Appln. KOKAI Publication No. 2004-61177) discloses a technique of measuring degradation in an optical element such as a mirror arranged in an exposure apparatus. However, regarding degradation in a light reflecting mask, it is difficult to measure the characteristics and change because the pattern formed on the mask is not uniform in general.

BRIEF SUMMARY OF THE INVENTION

According to an aspect of the present invention, there is provided a light reflecting mask comprising: a reflecting layer which is provided on a substrate and reflects light; an absorbing layer which is provided on the reflecting layer and absorbs light; a device pattern which is formed in a first region of the absorbing layer; and a reflectance measuring pattern which is formed in a second region of the absorbing layer. The reflectance measuring pattern is a diffraction grating.

According to an aspect of the present invention, there is provided an exposure apparatus comprising: a first light source which emits exposure light; a holding mechanism which holds a light reflecting mask having a reflectance measuring pattern; and a first photosensor which detects an intensity of light reflected by the reflectance measuring pattern.

According to an aspect of the present invention, there is provided a measuring method comprising: arranging a light reflecting mask having a device pattern and a reflectance measuring pattern; illuminating the device pattern and the reflectance measuring pattern with exposure light; and detecting an intensity of light reflected by the reflectance measuring pattern.

BRIEF DESCRIPTION OF THE SEVERAL VIEWS OF THE DRAWING

FIG. 1 is a sectional view showing the structure of a blank substrate used for a light reflecting mask 100 according to the first embodiment of the present invention;

FIG. 2 is a sectional view showing steps in the manufacture of the light reflecting mask 100;

FIG. 5 is a sectional view showing the structure of the light reflecting mask 100;

FIG. 6 is a schematic view showing the arrangement of an exposure apparatus 200 according to the first embodiment;

FIG. 10 is a schematic view showing the arrangement of the main part of an exposure apparatus 200 according to the third embodiment of the present invention; and FIG. 11 is a schematic view showing another arrangement of the exposure apparatus 200 according to the third embodiment.

DETAILED DESCRIPTION OF THE INVENTION

Figure 3:
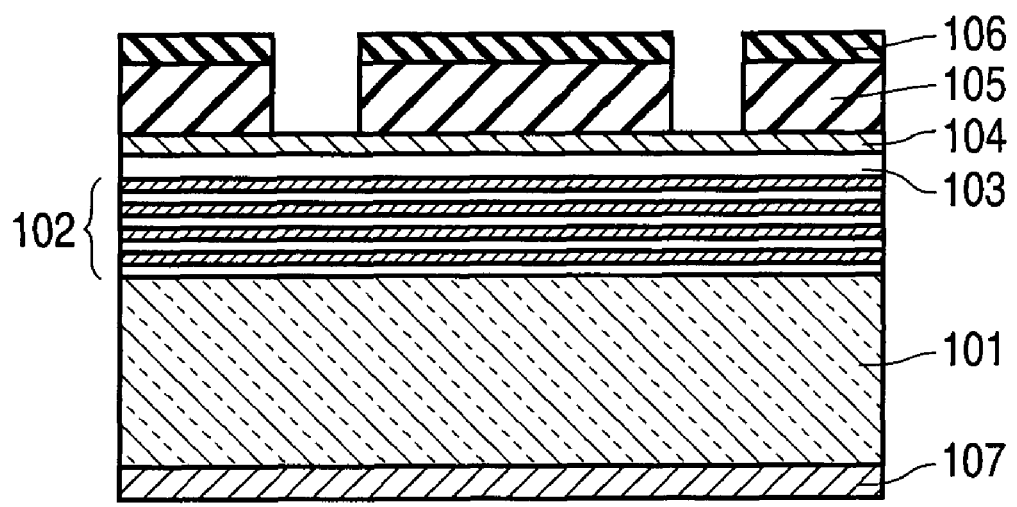
FIG. 3 is a sectional view showing steps in the manufacture of the light reflecting mask 100 following FIG. 2.

The embodiments of the present invention will be described hereinafter with reference to the accompanying drawings. In the description which follows, the same or functionally equivalent elements are denoted by the same reference numerals, to thereby simplify the description.

First Embodiment

FIG. 1 is a sectional view showing the structure of a blank substrate used for a light reflecting mask 100 according to the first embodiment of the present invention.

A reflecting layer 102 to reflect light is provided on the upper surface of a glass substrate 101 having a very small thermal expansion coefficient. The reflecting layer 102 is formed by stacking about 40 multilayered films of molybdenum (Mo)/silicon (Si) using sputtering. To protect the upper surface of the reflecting layer 102, a cap layer 103 made of, e.g., silicon (Si) or ruthenium (Ru) is provided on the reflecting layer 102.

A buffer layer 104 made of, e.g., chromium (Cr) is provided on the cap layer 103. To absorb EUV light, an absorbing layer 105 is provided on the buffer layer 104. A material containing tantalum (Ta) or chromium (Cr), e.g., tantalum nitride (TaN) is used as the absorbing layer 105.

To absorb inspection light having a wavelength of about 250 nm, an absorbing layer 106 made of, e.g., tantalum oxide (TaO) is provided on the absorbing layer 105. For an electrostatic chuck at the time of EUV exposure, a conductive layer 107 made of, e.g., chromium nitride (CrN) is provided on the lower surface of the glass substrate 101. In this way, a blank substrate used for the light reflecting mask 100 is obtained.

A method of manufacturing a light reflecting mask obtained having a desired pattern formed on a blank substrate will be explained next.

First, the blank substrate shown in FIG. 1 without any pattern is prepared. Next, a photosensitive resin (resist) 108 is applied to the upper surface of the blank substrate (i.e., the upper surface of the absorbing layer 106), as shown in FIG. 2. A desired pattern is drawn on the resist 108 using an electron beam. A post-exposure bake (PEB) step that is an annealing step after exposure, and a developing step are performed, thereby forming a resist pattern on the blank substrate.

Subsequently, the absorbing layers 105 and 106 are selectively etched by, e.g., a plasma process using the resist pattern as a mask, as shown in FIG. 3. Then, the resist pattern is removed.

Figure 4:
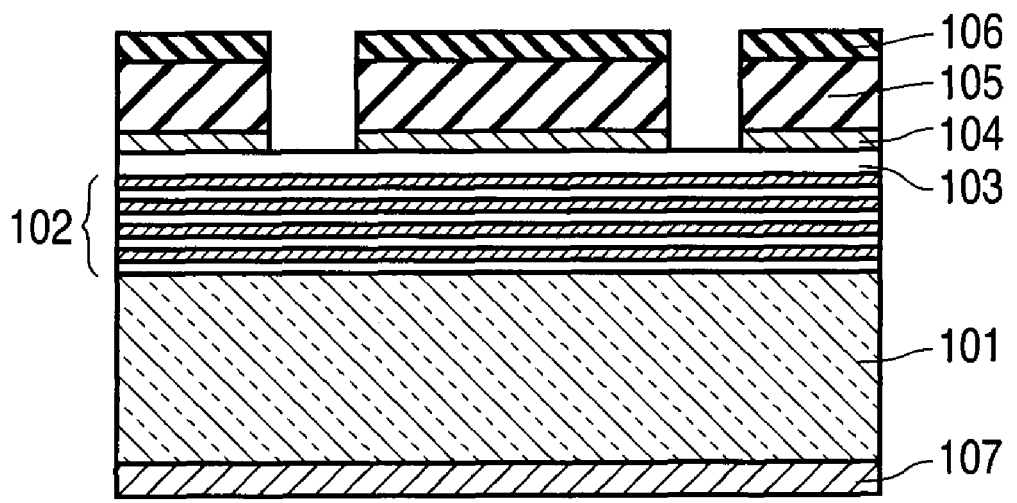
FIG. 4 is a sectional view showing steps in the manufacture of the light reflecting mask 100 following FIG. 3.

The buffer layer 104 is selectively etched by, e.g., a plasma process using the absorbing layers 105 and 106 as a mask, as shown in FIG. 4. With this process, the light reflecting surface (cap layer 103) is exposed, thus completing the light reflecting mask 100.

The light reflecting mask 100 of this embodiment includes a device pattern region 100A where a device pattern having device information is formed, and a reflectance measuring pattern region 100B where a reflectance measuring pattern to measure the reflectance of the light reflecting mask 100 is formed, as shown in FIG. 5. A diffraction grating is used as the reflectance measuring pattern.

In this embodiment, a line-and-space pattern is used as the diffraction grating, as shown in FIG. 5. Another example of the diffraction grating is a checkered pattern. The reflectance measuring pattern region 100B is provided adjacent to the device pattern region 100A. In a lithography step, the reflectance measuring pattern region 100B is illuminated with exposure light as much as the device pattern region 100A.

The arrangement of an exposure apparatus 200 will be described next. FIG. 6 is a schematic view showing the arrangement of the exposure apparatus 200. The exposure apparatus 200 includes an EUV light source 201, an illumination optical system 202, a mask holder (mask holding mechanism) 203 which holds the light reflecting mask 100, an imaging optical system 204, and a wafer stage (wafer holding mechanism) 205 which holds a wafer 206.

The EUV light source 201 supplies (emits) exposure light (EUV light). The illumination optical system 202 shapes the exposure light emitted by the EUV light source 201 and illuminates the light reflecting mask 100. The illumination optical system 202 also illuminates the device pattern region 100A and the reflectance measuring pattern region 100B of the light reflecting mask 100 with the exposure light. The mask holder 203 is formed from, e.g., an electrostatic chuck to fix the light reflecting mask 100. The imaging optical system 204 reduces and projects the exposure light reflected by the light reflecting mask 100 onto the wafer 206.

The exposure apparatus 200 of this embodiment also includes a photosensor 301 to detect, of the light reflected (diffracted) by the reflectance measuring pattern region 100B, higher order diffraction light that does not illuminate the wafer 206. More specifically, assume that zero-order diffraction light illuminates the wafer 206. In this case, the photosensor 301 detects higher order diffraction light of first order or higher. In other words, the photosensor 301 detects diffraction light having a diffraction angle larger than that of zero-order diffraction light. The photosensor 301 is arranged closer to the wafer 206 as compared to the light reflecting mask 100, and located at a place outside the path of the exposure light (zero-order diffraction light 303), where higher order diffraction light of first order or higher enters.

Figure 7:
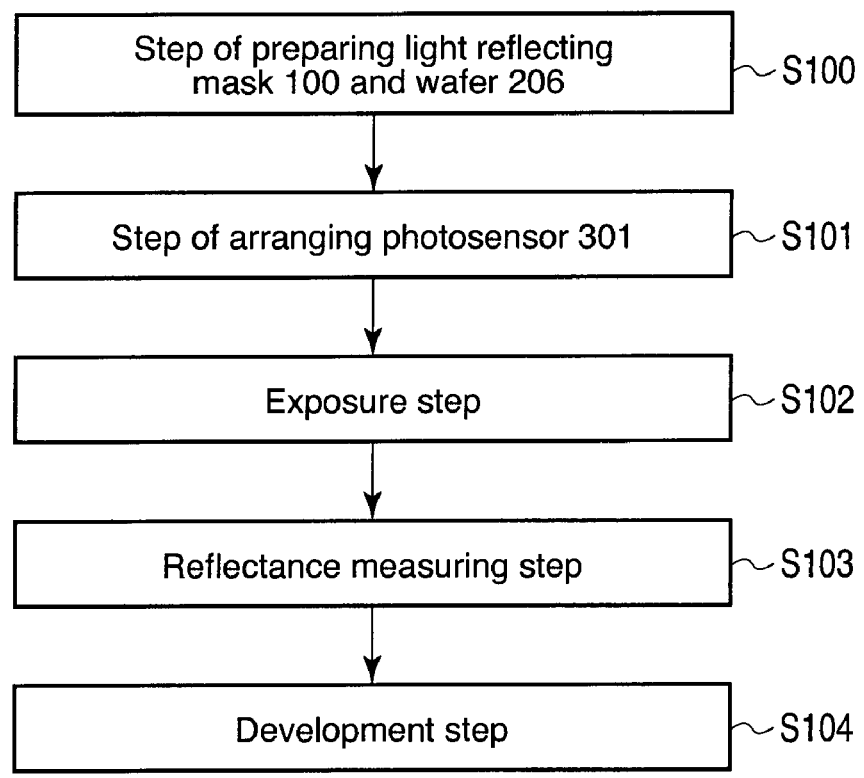
FIG. 7 is a flowchart illustrating a lithography method.

A lithography method using the light reflecting mask 100 will be described next. FIG. 7 is a flowchart illustrating a lithography method.

First, the light reflecting mask 100 and the wafer 206 having an applied resist are prepared (step S100). The light reflecting mask 100 is fixed on the mask holder 203 in the exposure apparatus 200. The wafer 206 is placed on the wafer stage 205. The photosensor 301 is arranged at a place outside the path of the exposure light, where higher order diffraction light reflected by the reflectance measuring pattern region 100B enters (step S101).

The device pattern formed in the device pattern region 100A is exposed to the wafer 206 using the EUV light source 201, illumination optical system 202, and imaging optical system 204 (step S102). At this time, the illumination optical system 202 illuminates even the reflectance measuring pattern region 100B with the EUV light from the EUV light source 201.

More specifically, exposure light emitted by the EUV light source 201 passes through the illumination optical system 202 and reaches the light reflecting mask 100 fixed on the mask holder 203 formed from, e.g., an electrostatic chuck, as shown in FIG. 6. The exposure light reflected by the light reflecting mask 100 passes through the imaging optical system 204 together with the pattern information of the light reflecting mask 100 and illuminates the wafer 206 fixed on the wafer stage 205. With this process, the pattern information of the light reflecting mask 100 is transferred to the resist on the wafer 206.

Figure 8:
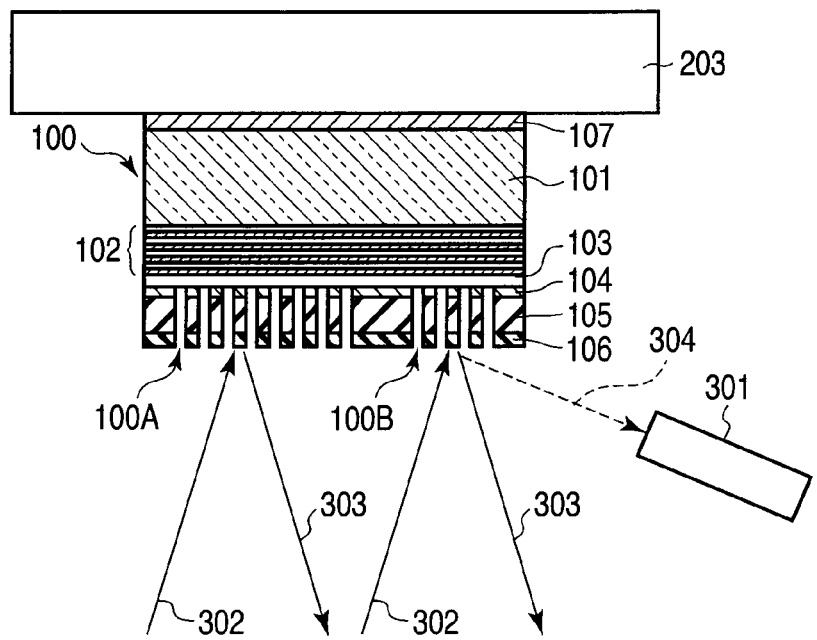
FIG. 8 is a schematic view for explaining detection of higher order diffraction light by a photosensor 301.

The illumination optical system 202 illuminates the reflectance measuring pattern region 100B with exposure light 302 as much as the device pattern region 100A, as shown in FIG. 8. Out of light components (zero-order diffraction light 303 and higher order diffraction light 304) reflected by the device pattern region 100A, the higher order diffraction light 304 enters the photosensor 301 during exposure of the wafer 206. The photosensor 301 detects the intensity of the received higher order diffraction light 304 (step S103). Measuring the light intensity enables in situ observation of a change in the reflectance of the light reflecting mask 100 during exposure.

After that, the wafer 206 is developed (step S104) to form, on it, the resist pattern having device information. The wafer 206 is etched using the resist pattern, thereby forming the device pattern on the wafer 206.

As described above in detail, according to this embodiment, the light reflecting mask 100 includes the device pattern region 100A where a pattern having device information is formed, and the reflectance measuring pattern region 100B where a reflectance measuring pattern to measure the degree of degradation in the mask reflectance is formed. It is possible to measure the degree of degradation in the reflectance of the light reflecting mask 100 by detecting the intensity of diffraction light from the reflectance measuring pattern region 100B.

The photosensor 301 to detect higher order diffraction light out of diffraction light components reflected by the light reflecting mask 100 is arranged outside the path of exposure light that illuminates the wafer 206. This enables to detect the intensity of light having a higher order diffraction angle during exposure. It is therefore possible to measure a change in the intensity of light that enters the imaging optical system 204 without any influence on wafer exposure.

Second Embodiment

In the second embodiment, a photosensor 401 to receive exposure light immediately before entering a light reflecting mask 100 is added. The photosensor 401 detects the intensity of exposure light immediately before entering the light reflecting mask 100.

Figure 9:
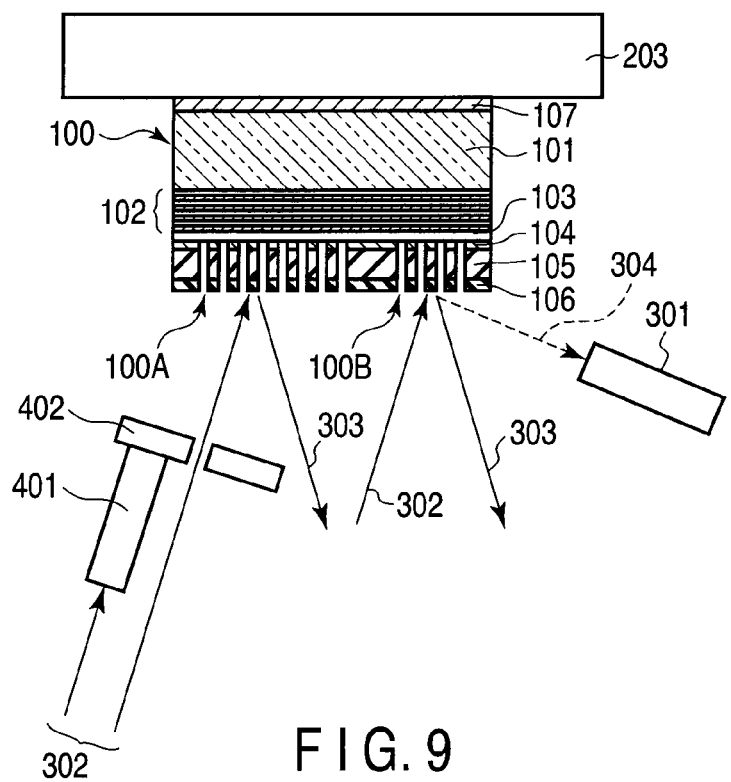
FIG. 9 is a schematic view showing the arrangement of the main part of an exposure apparatus 200 according to the second embodiment of the present invention.

FIG. 9 is a schematic view showing the arrangement of the main part of an exposure apparatus 200 according to the second embodiment of the present invention. The exposure apparatus 200 includes the photosensor 401 which detects the intensity of exposure light 302 from an illumination optical system 202 (i.e., the exposure light 302 immediately before it enters the light reflecting mask 100).

The photosensor 401 is arranged to receive the exposure light immediately before it enters the light reflecting mask 100. More specifically, the photosensor 401 is fixed on a holding mechanism 402 which has an aperture to pass the exposure light 302 from the illumination optical system 202. A photosensor 301 is arranged closer to the wafer as compared to the light reflecting mask 100, and located outside the path of zero-order diffraction light 303, as in the first embodiment.

When wafer exposure is performed in this state, the photosensor 401 can detect a light intensity equal to that of the exposure light 302 which enters the light reflecting mask 100. The photosensor 301 can detect the intensity of higher order diffraction light 304 reflected by a reflectance measuring pattern region 100B of the light reflecting mask 100, as in the first embodiment. It is therefore possible to separately measure a change in the reflection coefficient of the light reflecting mask 100 using the two kinds of light intensities obtained by the photosensors 401 and 301.

As described above in detail, according to this embodiment, it is possible to detect, during exposure, the intensity of light which enters the light reflecting mask 100 and the intensity of light reflected by the reflectance measuring pattern region 100B of the light reflecting mask 100.

Third Embodiment

In the third embodiment, a reflectance measuring pattern region 100B of a light reflecting mask 100 is directly illuminated with EUV light, and a photosensor 301 detects reflected light.

FIG. 10 is a schematic view showing the arrangement of the main part of an exposure apparatus 200 according to the third embodiment of the present invention. The exposure apparatus 200 includes an EUV light source 501 which supplies EUV light separately from an EUV light source 201 which supplies exposure light. The EUV light source 501 is arranged outside the path of exposure light 302 from an illumination optical system 202. The photosensor 301 is arranged closer to the wafer as compared to the light reflecting mask 100, and located outside the path of zero-order diffraction light 303.

During exposure, EUV light 502 emitted by the EUV light source 501 illuminates the reflectance measuring pattern region 100B of the light reflecting mask 100. The photosensor 301 detects the intensity of zero-order diffraction light 503 reflected by the reflectance measuring pattern region 100B. Measuring the light intensity enables in situ observation of a change in the reflectance of the light reflecting mask 100 during exposure.

Instead of providing the new EUV light source 501 in the exposure apparatus 200, EUV light emitted by the EUV light source 201 which supplies exposure light may directly illuminate the reflectance measuring pattern region 100B of the light reflecting mask 100. FIG. 11 is a schematic view showing another arrangement of the exposure apparatus 200.

The exposure apparatus 200 includes mirrors 505 and 506 necessary for directly illuminating the reflectance measuring pattern region 100B of the light reflecting mask 100 with the EUV light emitted by the EUV light source 201. The mirror 505 is fixed on a holding mechanism 504 which has an aperture to pass the EUV light from the EUV light source 201.

The EUV light 502 reflected by the mirror 506 illuminates the reflectance measuring pattern region 100B of the light reflecting mask 100 separately from the exposure light. The photosensor 301 detects the intensity of the zero-order diffraction light 503 reflected by the reflectance measuring pattern region 100B of the light reflecting mask 100. Measuring the light intensity enables in situ observation of a change in the reflectance of the light reflecting mask 100 during exposure.

Not EUV light but light having a wavelength longer than that of EUV light may be used as the light to directly illuminate the reflectance measuring pattern region 100B of the light reflecting mask 100. As the wavelength longer than that of EUV light, a wavelength capable of obtaining contrast on a mask and minimizing exposure of a resist is selected. In this embodiment, an example of light having a wavelength longer than that of EUV light is krypton fluoride (KrF) excimer laser light which ensures high contrast between an absorbing layer 105 and a reflecting layer 102.

In this case, the exposure apparatus 200 has the same arrangement as in FIG. 10. The light source 501 emits the KrF excimer laser light 502 during wafer exposure. The KrF excimer laser light 502 emitted by the EUV light source 501 illuminates the reflectance measuring pattern region 100B of the light reflecting mask 100. The photosensor 301 detects the intensity of the zero-order diffraction light 503 reflected by the reflectance measuring pattern region 100B. Measuring the light intensity enables measurement of the reflection coefficient of the light reflecting mask 100 with respect to the wavelength of the KrF excimer laser light 502.

Additionally, a database representing the relationship between the reflectance of a mask material and the wavelengths of the KrF excimer laser light 502 and the exposure light 302 is acquired. Comparing the obtained reflection coefficient with the database allows to measure a change in the reflectance with respect to the exposure light wavelength.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light reflecting mask comprising:
   a reflecting layer which is provided on a substrate and reflects light;
   an absorbing layer which is provided on the reflecting layer and absorbs light;
   a device pattern which is formed in a first region of the absorbing layer; and
   a reflectance measuring pattern which is formed in a second region of the absorbing layer,
   wherein the reflectance measuring pattern is a diffraction grating, and
   the reflectance measuring pattern is used for determining degradation of reflectance of the mask.

2. The mask according to claim 1, further comprising a cap layer which is provided between the reflecting layer and the absorbing layer and protects the reflecting layer.

3. The mask according to claim 2, wherein the cap layer is selected from the group consisting of silicon (Si) and ruthenium (Ru).

4. The mask according to claim 1, wherein the absorbing layer is made of a material including one of tantalum (Ta) and chromium (Cr).

5. The mask according to claim 1, wherein the diffraction grating is a line-and-space pattern.

6. The mask according to claim 1, wherein the diffraction grating is a checkered pattern.

7. The mask according to claim 1, wherein a diffraction light reflected by the reflectance measuring pattern is emitted outside a path of exposure light reflected by the device pattern.

* * * * *